United States Patent [19]

Kim

[11] Patent Number: 5,786,704
[45] Date of Patent: Jul. 28, 1998

[54] METALLIC TRAY UNIT FOR TESTING A SEMICONDUCTOR DEVICE

[75] Inventor: Du Chul Kim, Chunan, Rep. of Korea

[73] Assignee: Mirae Corporation, Rep. of Korea

[21] Appl. No.: 615,027

[22] Filed: Mar. 13, 1996

[30] Foreign Application Priority Data

Apr. 13, 1995 [KR] Rep. of Korea ............... 1995-7446

[51] Int. Cl.$^6$ ............................................. G01R 31/26
[52] U.S. Cl. .............. 324/765; 73/865.9; 269/254 R; 269/903
[58] Field of Search ............. 73/865.9; 324/765; 437/8, 209, 221, 924, 925, 984; 257/48, 727, 731, 732; 269/903, 206, 254 R, 287

[56] References Cited

U.S. PATENT DOCUMENTS

| | | | |
|---|---|---|---|
| 3,354,394 | 11/1967 | James | 324/765 |
| 3,568,263 | 3/1971 | Mechan | 269/903 X |
| 3,963,315 | 6/1976 | Bonis | 439/72 |
| 4,537,059 | 8/1985 | Sokolovsky | 73/7 |
| 5,281,320 | 1/1994 | Turner et al. | 269/254 R |
| 5,384,531 | 1/1995 | Yamazaki et al. | 324/765 |
| 5,422,579 | 6/1995 | Yamaguchi | 437/8 X |
| 5,444,388 | 8/1995 | Ideta et al. | 437/8 X |
| 5,528,159 | 6/1996 | Charlton et al. | 324/758 |
| 5,539,676 | 7/1996 | Yamaguchi | 324/758 X |

FOREIGN PATENT DOCUMENTS

| | | | |
|---|---|---|---|
| 85229 | 5/1982 | Japan | 269/254 R |
| 1226696 | 4/1996 | U.S.S.R. | 269/903 |

OTHER PUBLICATIONS

"Burn–In Method and Burn–In Board", *Patent Abstracts of Japan*; Grp P985, vol. 14, No. 1 Abs pub. date Jan. 8, 1990 (1-253663).

"Jig for Electrically Connecting Semiconductor Device"; *Patent Adstracts of Japan*; Grp P1018, vol. 14, No. 124 abs Pub date Mar. 8, 1990 (1-318977).

"Device for Testing Semiconductor Device"; *Patent Abstracts of Japan*; Grp E 1124, vol. 15, No. 412 Abs pub. date Oct. 21, 1991 (3-171646).

"Jig for Manufacturing Semiconductor and Testing Equipment Using that Jig"; *Patent Abstracts of Japan* (8–37225 dated Feb. 6, 1996).

*Primary Examiner*—Thomas P. Noland
*Attorney, Agent, or Firm*—Anthony J. Casella; Gerald E. Hespos; Ludomir A. Budzyn

[57] ABSTRACT

A metallic tray unit for testing a semiconductor device is disclosed including: a unit body on the bottom having a cavity in which a semiconductor device for testing is placed; and fixing equipment for holding the semiconductor device in the cavity when the semiconductor device is moved to the lower part of the unit body. The unit body has rectangular openings, one of which is opened in the direction of the upper part of the cavity and another which is opened toward the cavity. The fixing equipment includes plate springs that are installed on side walls of the openings in parallel thereto. The plate springs are opened as the device is inserted into the cavity, and then are returned to their former condition after insertion of the device thereto, whereby their ends exposed to the cavity catch the device. In addition, each of the plate springs includes on the end exposed to the cavity a catching lug for holding both ends of the device; and a guiding lug formed faced to the catching lug to lead the movement of the plate spring.

3 Claims, 5 Drawing Sheets

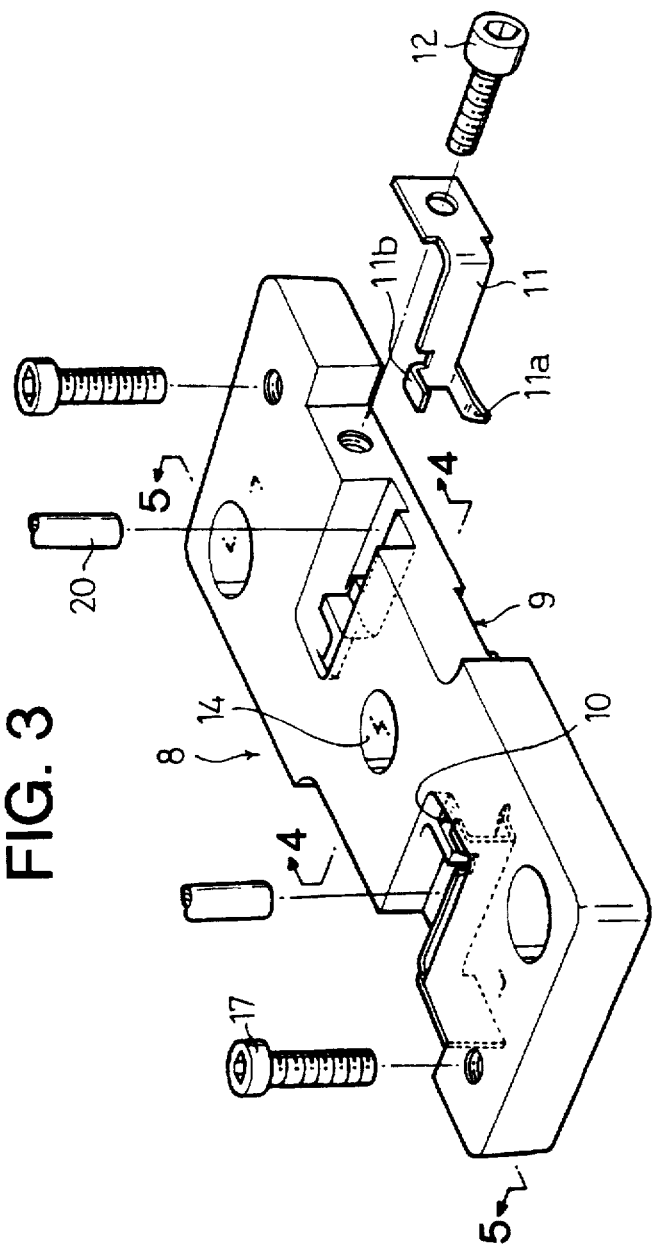
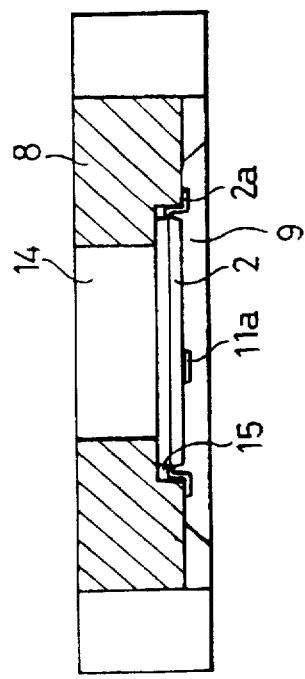

METALLIC TRAY UNIT FOR TESTING A SEMICONDUCTOR DEVICE

BACKGROUND OF THE INVENTION

1. Field of the Invention

The present invention relates to a metallic tray unit that is used for loading a semiconductor device and carrying it into a test procedure to check the characteristics of finished semiconductor devices by a handler. More particularly, it relates to a metallic tray unit into which a thin small outline package (TSOP) is inserted.

2. Description of the Prior Art

Semiconductor devices have been decreased in thickness and size in line with the microminiaturization of circuits, and there are thin small outline packages as typical ones of them.

The performance of the finished TSOP having a thickness of about 1 mm. is examined in a handler. The characteristics of the TSOP may deteriorate when its top or bottom is given a shock arising from careless handling of the TSOP in the course of being carried to a test procedure performed in the handler, and what is worse, such shocks cause a great damage to its shaped and processed chips.

Thus, close attention should be paid to transferring the TSOP in the handler or testing it in the tray not to shock the TSOP. Such a TSOP is placed on a unit body, and a plurality of such unit bodies (about fifty) are connected to each other by jigs to be transferred in the procedure.

FIG. 1 is a perspective view of a conventional tray unit, and FIG. 2 is a sectional view taken along the line 2—2. As shown in the drawings, the unit body 1 has a cavity 3 which a semiconductor device 2 is put into or taken out of, and rectangular openings 4 on both sides of the cavity 2 through which leads 2a of the device 2 are exposed to a lower part. The unit body 1 also includes on both ends wings 5 having guide slots 6 used to position the unit body 1 at the time of loading the semiconductor device 2, and screw-fastening holes 7 to fasten the unit body 1 to a jig (not shown) by a screw.

The jig being fastened to a plurality of such unit bodies is transferred to a loading position of the semiconductor device 2. The finished device 2 is then mounted in the cavity 3 of the unit body 1 by its weight.

More specifically, the finished device 2 that was put in a cassette (not shown) is held on to lifting means to be moved to the top of the unit body 1. By releasing the drawing power from the lifting means, the device 2 that was being held on to the lifting means' pad, becomes automatically placed in the cavity 3 of the unit body 1 by its weight.

When the device 2 is placed in the cavity 3, the leads 2a are then exposed to a lower part through the elongate rectangular openings 4. The jig then is moved to a testing part by transferring means. As the device is moved to the testing part, an insulator that comes down from the upper part of the jig, presses the leads 2a of the device, and test pins (not shown) that come up through the rectangular openings 4 make contact with the leads 2a. A central processing unit (CPU) is linked to the device through the test pins and leads 2a so that the CPU performs a test on characteristics of the device.

In order to nestle the device 2 in the cavity 3, the size of the cavity 3 is designed to be larger than the longitudinal width of the device, which causes the following problem. That is, when the lifting means holds the device 2 to load it in the cavity 3, the occasion that the device 2 is not placed correctly in the cavity 3 frequently arises, which is clearly understood from FIG. 2. If the test is performed in a testing part under these circumstances, the test pins do not make exact contact with the leads, and quality semiconductor devices may be misjudged low-quality ones.

Besides, even if the device 2 is loaded correctly in the cavity 3, when the jig containing the device is given a shock in course of being transferred in the test procedure, the device may deviate from the right position in the cavity, which causes misjudgement on the characteristics of semiconductor devices.

SUMMARY OF THE INVENTION

The present invention is intended to overcome the above-described disadvantage the conventional tray unit.

It is an object of the present invention to provide a tray unit that has a cavity on the bottom in which a semiconductor device is placed to be tested through the test procedure, by moving a jig to which the unit is connected.

In order to achieve this object, the inventive metallic tray unit includes:

a unit body on the bottom having a cavity in which a semiconductor device for testing is placed; and a fixing equipment for holding the semiconductor device in the cavity when the semiconductor device is moved to the lower part of the unit body to be inserted into the cavity by an insering equipment.

The fixing equipment has rectangular openings whose one is opened in the direction of the upper part of the cavity and the other is opened toward the cavity, and plate springs that are installed on side walls of the openings in parallel thereto, opened as the device is inserted into the cavity, and then return to their former condition after insertion of the device thereto. The plate springs' ends exposed to the cavity catch the device thereby. In addition, each of these plate springs includes on the end exposed to the cavity a catching lug for holding both ends of the device, and a guiding lug formed faced to the catching lug to lead the movement of the plate spring.

BRIEF DESCRIPTION OF THE ATTACHED DRAWINGS

The above object and other advantages of the present invention will become more apparent by describing in detail the preferred embodiments of the present invention with reference to the attached drawings in which:

FIG. 3 is an exploded-perspective view of a tray unit body in accordance with a preferred embodiment of the present invention;

FIG. 4 is a sectional view taken along the line 4—4 line of FIG. 3;

FIG. 5A depicts the state in which the unit body is transferred over a semiconductor device settling in an alignment block;

FIG. 5B depicts the state in which the alignment block is raised to make contact with a device-landing surface of the cavity;

FIG. 5C depicts the state in which a lift descends so that plate spring-opening pins make contact with plate springs;

FIG. 5D depicts the state in which the plate spring-opening pins are moved to both sides by opening means to get the plate springs open;

FIG. 5E depicts the state in which a device-landing block is raised so that the device makes contact with the bottom of the unit body; and FIG. 5F depicts the state in which the device-landing block descends, simultaneously with returning the plate spring-opening pins to their former condition, and the semiconductor device gets caught by catching lugs of the plate springs.

DETAILED DESCRIPTION OF THE INVENTION

Figure 1:
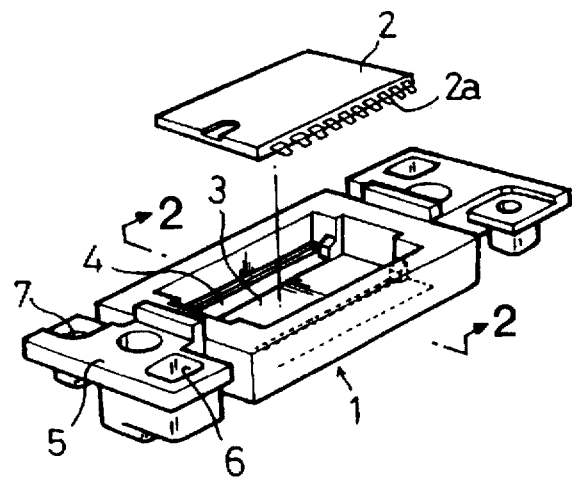
FIG. 1 is a perspective view of a conventional tray unit body.
Figure 2:
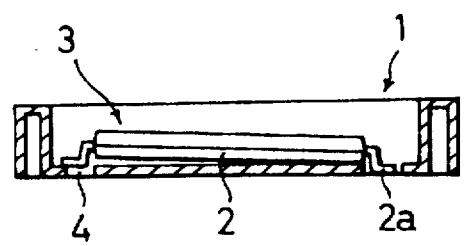
FIG. 2 is a sectional view taken along the line 2—2 of FIG. 1.

The present invention will be described in detail with reference to the accompanying drawings.

As shown in FIGS. 3 and 5, a device-inserting equipment includes an alignment block 18 for transferring a semiconductor device 2 to the lower part of a tray unit body 8, a mounting plate 22 for moving the alignment block 18 upward so that the alignment block 18 keeps close to the bottom of the tray unit body 8, and a device-landing block 19 for inserting the device 2 into a cavity 9 as the alignment block 18 keeps close to the bottom of the tray unit body 8.

A device-fixing equipment includes on both sides of the cavity 9, rectangular openings 10 with one end of each opening 10 being opened in the direction of the upper part of the cavity 9 and the other end being opened toward the cavity 9, and plate springs 11 that are installed on the side walls in parallel thereto, opened as the device 2 is inserted into the cavity 9, and then returned to their former condition after insertion of the device so that their ends exposed to the cavity may catch the device.

Each of the plate springs 11 has a catching lug 11a for holding both ends of the device 2, and a guiding lug 11b formed to face the catching lug 11a to lead the movement of the plate spring 11. The respective rectangular openings 10 are disposed on a predetermined point of the both sides of the cavity which is exterior to a longitudinal width L of the device. Each plate spring 11 is fixed by a screw 12, and each of the catching lugs 11a fixed on the unit body 8 is disposed on a point which is interior to the width L of the device to get into the cavity 9. The guiding lug 11b is integrally formed with the plate spring body to guide the position of the catching lug 11a when the plate springs are moved.

The unit body 8 has a hollow 14 on the center, and as a pushing pin 13 is inserted to the hollow 14, the pushing pin 13 gets into the cavity 9. Accordingly, as the catching lugs 11a holding the device 2 come loose by plate spring-opening pins 20, the semiconductor device standing close to a device-landing surface 15 of the cavity 9 may be easily detached therefrom by restoring force of the pushing pin 13.

The following description relates to the operation of the inventive unit.

FIGS. 5A to 5F are views in operation applying the present invention, and show the steps of loading semiconductor devices 2 in each cavity 9 of the unit bodies 9 in the state of fastening a plurality of the unit bodies 8 to the lower part of the jig 16 by bolts 17.

Figure 5A:
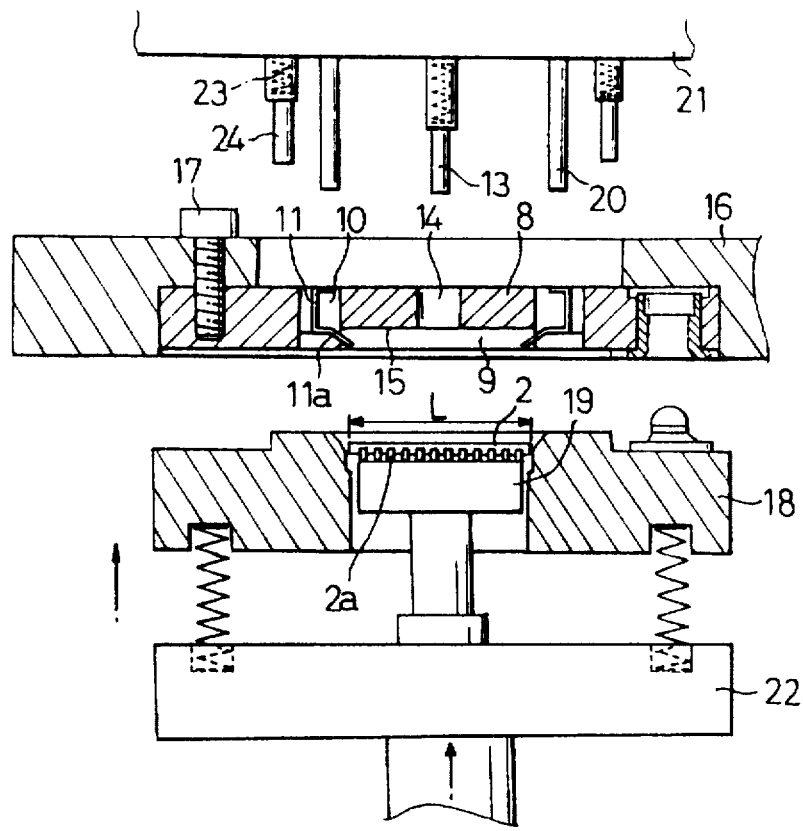
FIGS. 5A to 5F are cross-sectional views taken along line 5—5 in FIG. 3 in operation applying the present invention.

Referring to FIG. 5A, the semiconductor device 2 is put and positioned on the device-landing block 19 that is installed in the alignment block 18 to move up and down. When the alignment block 18 is transferred to the lower part of the unit body 8 by transferring means, a lift 21 having plate spring-opening pins 20 is moved to stop over the jig.

Figure 5B:
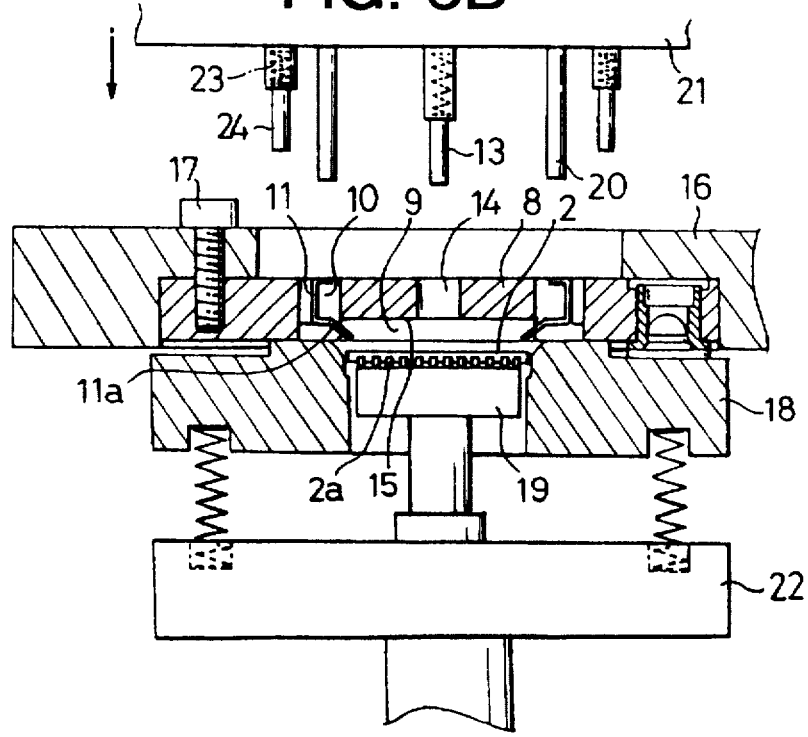
Figure 5C:
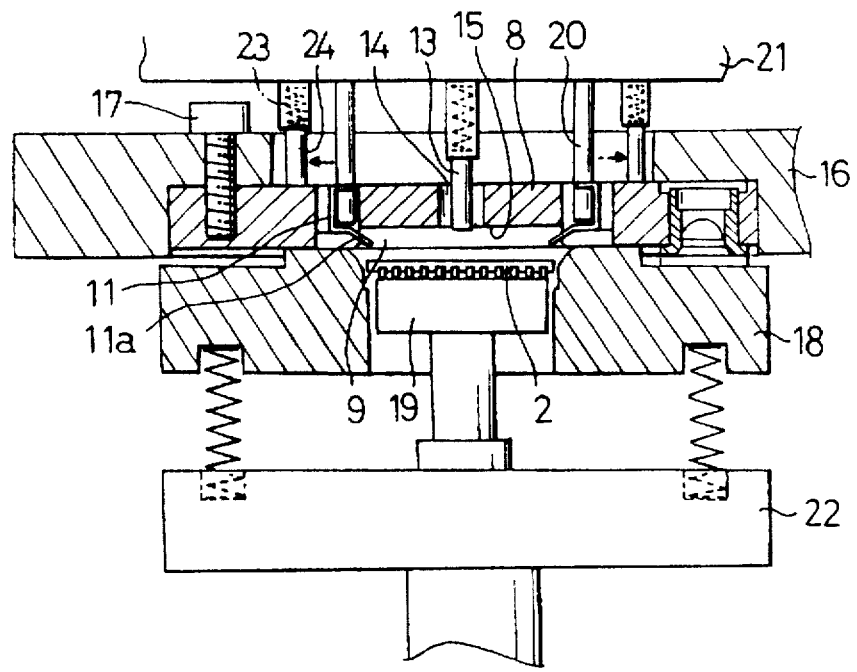

When the alignment block 18 is raised by a first cylinder (not shown) fixed to a mounting plate 22 as shown in FIG. 5B, the top of the alignment block 18 makes contact with the bottom of the unit body 8. The device 2 being placed on the device-landing block 19 is not yet inserted into the cavity 9, at this point.

After the ascent of the alignment block 18, the lift 21 over the jig 16 moves down so that pressing pins 24 elastically formed with springs 23 press the upper part of the unit body 8, simultaneously with inserting the plate spring-opening pins 20 into the rectangular openings 10 of the unit body 8. The pushing pin 13 gets into the cavity 9 through the hollow 14 formed on the center of the unit body 8.

Figure 5D:
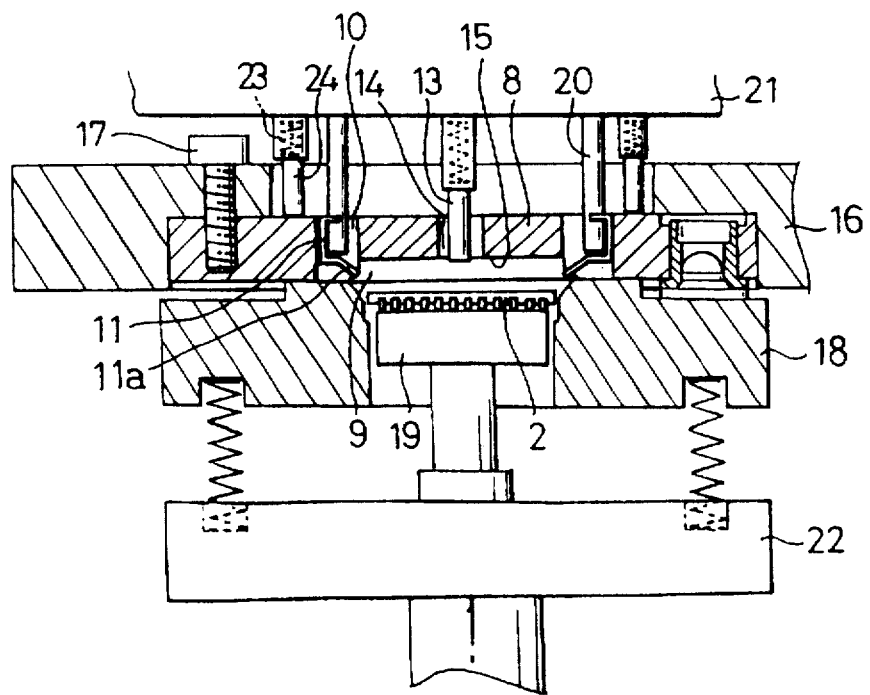
Figure 5E:
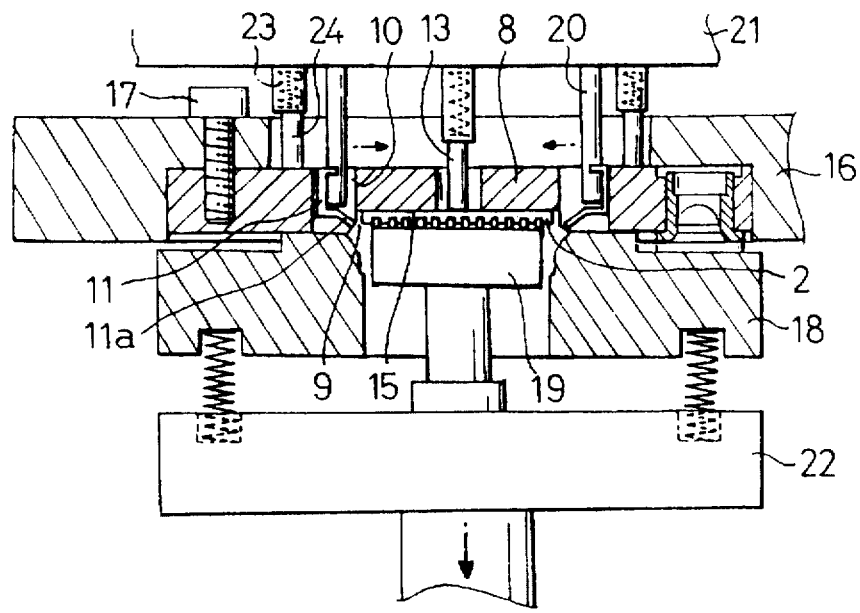
Figure 5F:
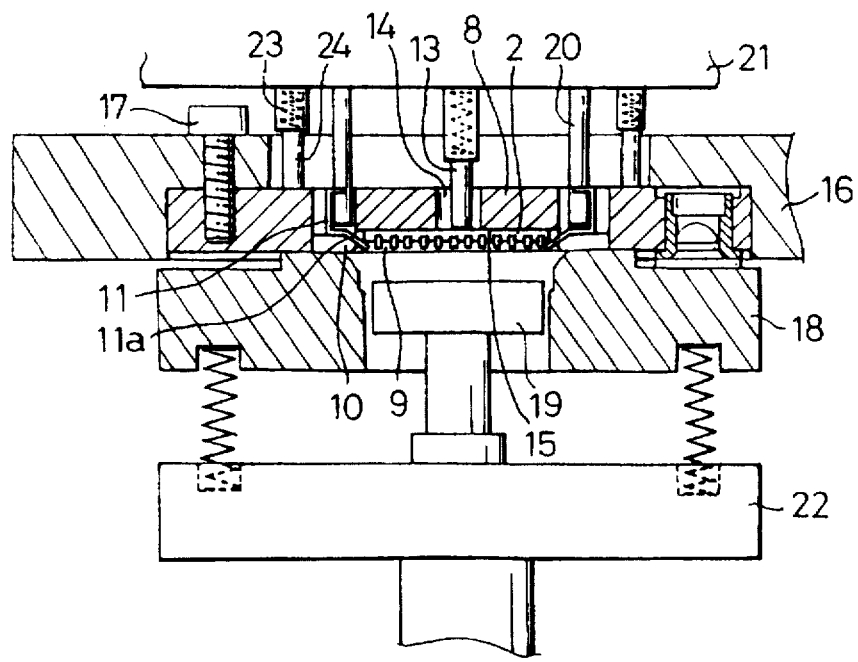

The plate spring-opening pins 20 are then moved to be opened by links and the like, and each of the catching lugs 11a of the plate springs 11 becomes disposed on a point exterior to the longitudinal width L of the device 2, which is depicted in FIG. 5D. The device-landing block 19 is then raised by the cylinder (not shown). The upper surface of the device 2 in the device-landing block contacts the device-landing surface 15, and the pushing pin 13 is pushed upward by the upper surface of the device 2 to have power of compression.

Once the device 2 that was placed in the device-landing block 19 is put in the cavity 9, the plate spring-opening pins 20 that are moved to the outside return to the initial state. Thus, the catching lug 11a that was placed on the point exterior to the width L of the device 2, is moved to the inside of the width L to hold the device 2.

After loading the device 2 on the unit body 8, the device-landing block 19 and mounting plate 22 descend by the cylinder, and the lift 21 ascends at the same time, thereby completing the loading of the device on the unit body of the first row.

The alignment block 18 is again transferred to device-supplying means so that a semiconductor device to be loaded on a unit body of some other row nestles in the device-landing block. Thus the loading of semiconductor devices may be continuously performed thereby.

The above-mentioned present invention may attain the following advantages.

First, the semiconductor devices to be examined are placed correctly on the unit body to enable correct judgement on the characteristics of each semiconductor device. Second, even if the jig is given a shock in the course of transfer, the devices do not deviate from their right position to enhance accuracy in the judgement.

While this invention has been described in connection with what is presently considered to be the most practical and preferred embodiments, it is to be understood that the invention is not limited to the disclosed embodiments, but, on the contrary, it is intended to cover various modifications and equivalent arrangements included within the spirit and scope of the appended claims.

What is claimed is:

1. A metallic tray unit for testing a semiconductor device comprising:
   a unit body having a bottom and a top, the bottom being formed with a cavity in which the semiconductor device to be tested is placed, rectangular openings respectively formed on opposite sides of the cavity, each rectangular opening having one end opened to the top of the unit body and the other opened into the cavity formed in the bottom of the unit body; and
   fixing means for holding the semiconductor device in the cavity when the semiconductor device is moved to the bottom of the unit body and into the cavity, the fixing means comprising plate springs installed on side walls of said rectangular openings and parallel thereto, said plate springs being opened for insertion of the device into the cavity and being returned to a former condition thereof after insertion of the device into the cavity so that ends of the plate springs exposed to the cavity catch the device.

2. The unit as recited in claim 1, wherein each of the plate springs includes on the end exposed to the cavity:

a catching lug for holding opposing ends of the device; and a guiding lug formed to face the catching lug to lead the movement of the plate spring.

3. The unit as recited in claim 1, wherein the unit body has an opening therethrough in the center into which a member for pushing the semiconductor device elastically, as the device is fixed by the fixing means, is inserted.

* * * * *